US008836133B2

(12) United States Patent
Huang et al.

(10) Patent No.: US 8,836,133 B2

(45) Date of Patent: Sep. 16, 2014

(54) CHIP-LEVEL HUMIDITY PROTECTION

(71) Applicants: Jenn Hwa Huang, Chandler, AZ (US); Jose L. Suarez, Chandler, AZ (US); Yun Wei, Chandler, AZ (US)

(72) Inventors: Jenn Hwa Huang, Chandler, AZ (US); Jose L. Suarez, Chandler, AZ (US); Yun Wei, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/650,872

(22) Filed: Oct. 12, 2012

(65) Prior Publication Data

US 2014/0103532 A1 Apr. 17, 2014

(51) Int. Cl.
*H01L 23/532* (2006.01)

(52) U.S. Cl.
USPC .................. 257/773; 257/E21.585; 438/637; 438/667

(58) Field of Classification Search
USPC ........... 257/773, E21.585; 438/637, 667, 598
See application file for complete search history.

(56) References Cited

U.S. PATENT DOCUMENTS

| | | | | |
|---|---|---|---|---|
| 5,284,801 | A | 2/1994 | Page et al. | |
| 8,076,780 | B2 | 12/2011 | Saigoh et al. | |
| 2013/0075859 | A1 * | 3/2013 | Kerber | 257/531 |

OTHER PUBLICATIONS

Ofer Sneh et al., "Thin Film Atomic Layer Deposition Equipment for Semiconductor Processing," Thin Solid Films, vol. 402, pp. 248-261, 2002.

* cited by examiner

*Primary Examiner* — Roy Potter

(74) *Attorney, Agent, or Firm* — Lempia Summerfield Katz LLC

(57) ABSTRACT

An electronic apparatus includes a semiconductor substrate, a device structure supported by the semiconductor substrate, and a guard ring surrounding the device structure. The guard ring includes a plurality of conductive structures spaced apart from one another, supported by the semiconductor substrate, and coupled to a voltage source to establish an operating voltage for the guard ring.

20 Claims, 4 Drawing Sheets

CHIP-LEVEL HUMIDITY PROTECTION

FIELD OF INVENTION

The present embodiments relate to semiconductor devices.

BACKGROUND

Semiconductor devices used in high performance applications are often compound semiconductor devices. Group III-V semiconductor devices, such as GaAs and GaN, are typical compound semiconductor materials used in high performance applications. GaAs devices are often used in high voltage, high power, and high frequency products. Volume production for more widespread application of such products has called for compound semiconductor device products to be small in size and cost competitive.

Interest in fabrication cost reduction has lead to low cost packaging of compound semiconductor devices. High power and high frequency devices were traditionally packaged in hermetically sealed, cavity-type packages. Such packages usually provide adequate moisture protection at the chip level. While cheaper, plastic packaging does not provide a good moisture barrier. Plastic packages may thus leave moisture protection to the chip itself.

Ohmic fences have been used to provide moisture protection in GaAs devices and products with plastic packaging. Unfortunately, circuit layouts with ohmic fences were unable to prevent chip level failures during conventional temperature, humidity, bias (THB) testing. Humidity penetrating through the plastic packaging lead to the failures.

Changes to the circuit layout and fabrication process have also been unsuccessful. For example, a moisture resistant barrier between a polyimide layer and a metallization line may retard corrosion of the metallization line by blocking water released from polyimide layer. Despite such efforts, humidity penetration problems still persist.

Other efforts have focused on configuring bond pads with a protective metallic layer to block moisture. Even if successful, such efforts fail to address moisture penetration from the edge and the top of a chip.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
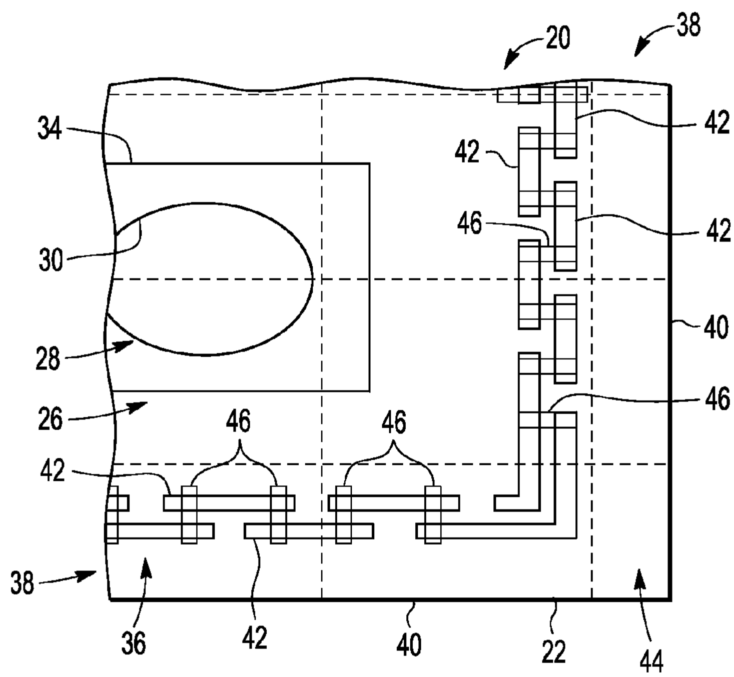
FIG. 1 is a partial, top view of an exemplary semiconductor device having an ohmic fence for chip-level humidity protection in accordance with one embodiment.

Semiconductor devices having chip-level humidity protection are described. Methods of fabricating such semiconductor devices are also described. The disclosed devices may utilize one or more humidity protection techniques, which may address multiple moisture paths into a chip. The disclosed techniques may minimize or prevent moisture penetration at or along the edge of the chip. The disclosed techniques may alternatively or additionally minimize or prevent moisture penetration at or along edges of bond pads. Alternative or additional protection for the bond pads may be provided by the disclosed techniques by preventing moisture penetration and/or migration at or along passivation via openings and other metal layer (e.g., interconnect) sidewalls. Damage to metal and/or dielectric layers arising from humidity or other moisture from the ambient may be avoided by addressing one or more of these moisture paths.

One or more of the disclosed techniques may prevent or minimize damage if moisture penetrates into the interior of a semiconductor chip. Without the disclosed techniques, the moisture may travel faster along a sidewall of a metal line than at a top or bottom surface of the metal line. This effect may arise from the absence of an adhesion layer along the sidewall, which, in turn, may arise from metal etching, plating, or lift-off techniques employed to define the metal lines. The disclosed techniques may address the lack of adhesion metal layers on the sidewalls of the metal lines.

One or more of the disclosed humidity protection structures may be fabricated using process steps directed to fabricating other device structures. The disclosed devices may thus enhance the humidity protection while avoiding additional fabrication process costs.

Although described below in connection with substrates having compound semiconductor materials, the disclosed devices and fabrication methods are not limited to any particular substrate type or material. The disclosed devices and methods are not limited to GaAs, GaN, SiC and other compound semiconductor substrates. The semiconductor substrates of the disclosed devices may vary. For example, the substrate may be configured as a silicon-on-insulator (SOI) substrate. Materials other than silicon may be used.

Although described below in connection with field-effect transistor (FET) devices, the disclosed devices and methods are not limited to any particular transistor or other device configuration. The transistors are also not limited to a particular type of charge carrier or conductivity type. To the extent that any of the figures imply a particular charge carrier or conductivity type, charge carriers of the opposite type may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

Although described below in connection with plastic packages, the disclosed devices and methods are not limited to any particular packaging technology, material, or process. The disclosed devices need not be enclosed by a plastic housing. The extent to which the housing or packaging provides a moisture barrier may vary. The disclosed devices and methods may be combined with hermetic or near hermetic packaging to provide redundant protection against moisture or protection during fabrication before packaging. For example, the disclosed devices and methods may help to address moisture trapped within polyimide or other moisture-trapping materials. Such moisture may be blocked from further penetration into an active area or interface of the chip.

FIG. 1 shows a top view of an example of an electronic apparatus configured with chip-level humidity protection in accordance with one embodiment. In this example, the electronic apparatus is an integrated circuit (IC) device or chip 20. The IC chip 20 includes a semiconductor substrate 22, which may be a composite substrate with any number of layers (e.g., epitaxial layers). In one example, the semiconductor substrate 22 includes a GaAs or other Group III-V compound semiconductor material. The semiconductor substrate 22 may be a lightly or heavily doped p-type or n-type substrate. The IC chip 20 may include any number of transistor or other semiconductor devices formed in and/or supported by the semiconductor substrate 22. The semiconductor devices may be disposed in a circuit arrangement that extends laterally across a surface 24 (FIG. 2) of semiconductor substrate 22.

The structural, material, and other characteristics of the semiconductor substrate 22 may vary. Additional, fewer, or alternative layers may be included in the semiconductor substrate 22. For example, any number of additional semiconductor and/or non-semiconductor layers may be included. The disclosed devices are thus not limited to, for instance, bulk substrates. The semiconductor substrate 22 may be configured as a semiconductor-on-insulator (SOI) substrate. The semiconductor substrate 22 may be supported by a wide variety of other types of semiconductor or non-semiconductor substrates.

Figure 2:
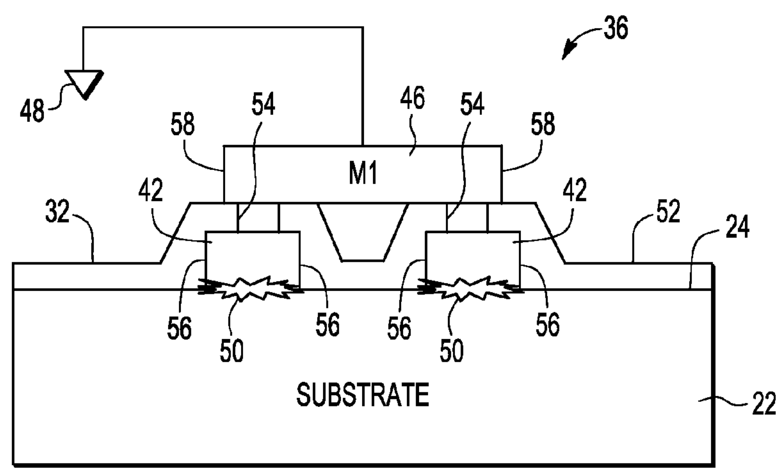
FIG. 2 is a cross-sectional, schematic view of the ohmic fence shown in FIG. 1.

A portion of a device or circuit area 26 is depicted in the top view of FIG. 1. The structures, regions, and other elements of the IC chip 20 in the circuit area 26 may vary. In this example, the circuit area 26 includes a device structure 28, the shape, purpose, materials, construction, and other characteristics of which may vary considerably from the example shown. In this example, the device structure 28 is part of a grounding or contact pad to establish a connection to a back side of the IC chip 20. The circuit area 26 may include any number or arrangement of devices or device structures. The device structure 28 may include one or more regions or components disposed within the semiconductor substrate 22 and/or one or more components supported by the semiconductor substrate 22. In some examples, the device structure 28 includes a metal or other conductive structure 30, which may be patterned to form a contact or other component of a device, such as a FET device. The conductive structure 30 may include one or more metal layers, which may be arranged in a stack. The metal layers may include different metals for purposes of forming or providing a transition layer, an adhesion layer, an ohmic contact layer, and/or other layers. The conductive structure 30 is supported by the semiconductor substrate 22 and may be passivated by one or more dielectric layers. For example, the conductive structure 30 may be passivated by one or more dielectric layers 32 that cover the surface 24 of the semiconductor substrate 22, as shown in FIG. 2. Sidewalls 34 of the conductive structure 30 in FIG. 1 may be coated or covered to provide humidity protection as described below in connection with FIGS. 4 and 5.

As shown in FIG. 1, the IC chip 20 includes a guard ring 36 to provide humidity protection at the chip level. The guard ring 36 may be configured as a fence or barrier that surrounds the circuit area 26 and thus each device structure 28 located therein. The guard ring 36 is disposed along a periphery 38 of the semiconductor substrate 22 and along an edge 40 of the IC chip 20. The guard ring 36 may be spaced from the edge 40 to any desired extent. The spacing may vary along the periphery 38. While the guard ring 36 may define the circuit area 26 for the IC chip 20, one or more circuit or device elements may be located outside of the guard ring 36 in some cases.

The guard ring 36 is configured to block or prevent moisture from traveling from the edge 40 to reach the circuit area 26. The guard ring 36 may thus be considered a chip guard ring or circuit guard ring. The guard ring 36 may be configured to prevent moisture from passing between the guard ring 36 and the semiconductor substrate 22. For example, the guard ring 36 may be deposited on the semiconductor substrate 22 such that an alloy is formed at the interface of the guard ring 36 and the semiconductor substrate 22. The guard ring 36 may alternatively or additionally be biased or coupled to a voltage source to establish a voltage along the guard ring 36 that traps the moisture, as described below.

The guard ring 36 may be discontinuous to avoid metal lift-off or other patterning complications. In this embodiment, the guard ring 36 includes a plurality of conductive structures 42 spaced apart from one another. Adjacent conductive structures 42 laterally overlap one another to remove any straight paths for moisture. In this example, the conductive structures 42 are disposed in a staggered arrangement. The staggered arrangement disposes the conductive structures 42 in one of two rows that extend around the periphery 38. Other staggered or overlapping arrangements may be used. The conductive structures 42 may be arranged in any number of rows. The conductive structures need not be arranged in rows. Other fence arrangements may be used.

In this embodiment, each conductive structure 42 outside of a corner 44 of the periphery 38 is block-shaped or rectangular when viewed from above. The conductive structures 42 in the corner 44 may be L-shaped as shown. The shape and sizing of the conductive structures 42 may vary from the example shown. For example, any number of the conductive structures 42 may have a complex or non-straight shape, such as a serpentine shape. The conductive structures 42 need not be rectilinear, and may have one or more curved sides.

In the embodiment of FIG. 1, the guard ring 36 includes a number of conductive bridges 46 that couple adjacent conductive structures 42. Each conductive structure 42 is linked to a pair of adjacent, laterally overlapping conductive structures 42 by respective bridges 46. The bridges 46 establish a conduction path that couples each conductive structure 42 to a bias or operating voltage for the guard ring 36. As schematically shown in FIG. 2, the conductive structures 42 and the bridges 46 are coupled to a voltage source 48, such as ground. Biasing or grounding the guard ring 36 may help trap or block the moisture through electrostatic interactions with ions in the moisture, such as disassociated water ions or other ions. The voltage source 48 need not bias the guard ring 36 at ground potential, and instead may establish any desired operating voltage for the guard ring 36. The shape, lateral positioning, profile, and other characteristics of the bridges 46 along each conductive structure 42 may vary.

The lateral cross-section of FIG. 2 shows a portion of the guard ring 36 in greater detail. Each conductive structure 42 is supported by, and formed on, the semiconductor substrate 22. In this example, the conductive structures 42 include a metal layer configured to form an alloy with the semiconductor substrate 22 to establish an ohmic interface 50 at the surface 24 the semiconductor substrate 22. The guard ring 36 may thus be configured as an ohmic fence that blocks moisture from passing between the conductive structure 42 and the semiconductor substrate 22. The guard ring 36 may thus block moisture from reaching the circuit area 26 (FIG. 1) via a path along the surface 24 of the semiconductor substrate 22. Such moisture may be present at the surface 24 by entering from the edge 40 (FIG. 1) of the IC chip 20 and traveling along an interface between a dielectric passivation layer 52 and the semiconductor substrate 22.

The bridges 46 electrically connect the conductive structures 42 that form the guard ring 36 to provide moisture protection in addition to the physical barrier arising from the ohmic fence or barrier. Moisture entering from the edge 40 of the IC chip 20 thus encounters a grounded or biased metal fence, rather than simply an ohmic barrier, which may be broken or staggered to improve metal lift-off or other patterning. The disclosed devices and methods need not rely solely on the physical barrier to moisture penetration provided by the alloying of the conductive structures 42 into the semiconductor substrate 22.

In embodiments having a Group III-V substrate (e.g., GaAs, InP, etc.), the metal layer of each conductive structure 42 may include Au-based material combinations, such as Ni/Au/Ge. Each conductive structure 42 may be a composite structure or stack of multiple metal layers. Any metal, metal alloy, or other metal combination that forms an alloy with the semiconductor substrate 22 may be used to form the ohmic fence. In some cases, a silicide is formed. The metal layer or layers may be deposited via electroplating, dry etching, or any other now or hereafter developed deposition process.

The passivation layer 52 may extend across the surface 24 to passivate the periphery 38 of the IC chip 20, including the conductive structures 42. The passivation layer 52 is patterned to allow each bridge 46 to connect with the respective pair of adjacent conductive structures 42. Each bridge 46 may extend into openings 54 formed in the passivation layer 52 to meet and establish a connection with the conductive structures 42. One or more dielectric materials may be incorporated into the passivation layer 52. For example, the passivation layer 52 may include silicon oxide (e.g., $SiO_2$), silicon nitride (e.g., $Si_3N_4$), silicon oxynitride ($SiO_xN_y$), aluminum oxide (e.g., $Al_2O_3$), etc. One or more additional passivation layers may be deposited on the passivation layer 52 and the bridges 46 and other conductive structures formed via the metal layer(s) that form the bridges 46.

The bridges 46 may be formed in connection with deposition of a first metal layer (e.g., M1) of the process of fabricating the IC chip 20. Each bridge 46 may include a metal stack or other composite arrangement of the first metal layer. For example, each bridge 46 may include one or more transition layers, one or more adhesion layers, and/or other layers in addition to a gold (Au) or other primary conduction layer. Exemplary materials for the transition layer(s) include Ni, Mo, Pd, Pt, etc., as well as alloys thereof or multi-layered composite metal films including any combination thereof. Exemplary materials for the adhesion layer(s) include Ti, TiN, TiW, Cr, etc. The construction, materials, and other characteristics of the metal stack or other configuration of the bridges 46 may vary.

The conductive structures 42 need not be connected by segments of the first metal layer (M1). Other, e.g., higher level, metal layers may be used. In some embodiments, the conductive structures may be coupled to the voltage source 48 via a connection path embedded in the semiconductor substrate 22. For example, the semiconductor substrate 22 may include one or more regions having a high dopant concentration to establish a sufficiently low resistivity for the connection path. The disclosed devices and methods are thus not limited to ohmic fences or guard rings having bridges spanning staggered or otherwise spaced apart conductive structures.

In some embodiments, the passivation layers of the IC chip 20 may include an atomic layer deposition (ALD) film or other conformal film at or along sidewalls of the metal layers. For instance, the passivation layer 52 may be supplemented with a dielectric film that better conforms to sidewalls 56 of the conductive structures 42. For example, one or more layers of the ohmic fence structures described herein may be coated with an ALD film as described below. The improved conformity of the dielectric film may minimize or prevent moisture from passing the ohmic fence by, for instance, traveling along the metal-dielectric interface with cracks or other non-conformities. While such travel along or past the metal-dielectric interface at the conductive structures 42 is unlikely given the electrostatic effects of the voltage at the established by the voltage source 48, the conformal dielectric film may provide backup, redundant, or additional protection.

One or more additional conformal dielectric films may be deposited along sidewalls 58 of the bridges 46 and other metal structures formed via the first metal layer of the IC chip 20, such as interconnects. The film(s) may be deposited to prevent cracks or other non-conformities from providing a moisture path along the interface between the metal stack of the bridges 46 and the passivation layer(s) of the IC chip 20. Cracks and non-conformities may otherwise be present because the sidewalls 58 are not coated or covered with an adhesion layer, such as a Ti adhesion layer. The passivation layer 52 may be configured as an interlayer dielectric layer (ILD) of the passivation of multiple metal layers of the IC chip 20.

The conformal dielectric films may be formed via atomic layer deposition (ALD) techniques. Examples of conformal ALD films that may be used include aluminum oxide ($Al_2O_3$), aluminum nitride (AlN), and hafnium oxide ($HfO_2$). The conformal ALD film may include any one or more of such materials. The conformal dielectric film may be patterned such that only areas at or along the sidewalls are covered. Further details regarding the deposition of such conformal dielectric films are provided below in connection with FIGS. 4 and 5.

The IC chip 20 is shown in simplified form and, thus, FIGS. 1 and 2 do not show all of the metal, passivation, and/or other layers supported by the semiconductor substrate 22. FIGS. 1 and 2 also do not show any of the regions of the semiconductor substrate 22 configured to form one or more transistor or other devices of the IC chip 20. The IC chip 20 may have a number of other structures or components for connectivity, isolation, packaging, and other purposes not shown in FIG. 1 for ease in illustration. For instance, the IC chip 20 may include an enclosure, lead frame, or other packaging element coupled to the semiconductor substrate 22 and/or other components of the IC chip 20.

Figure 3:
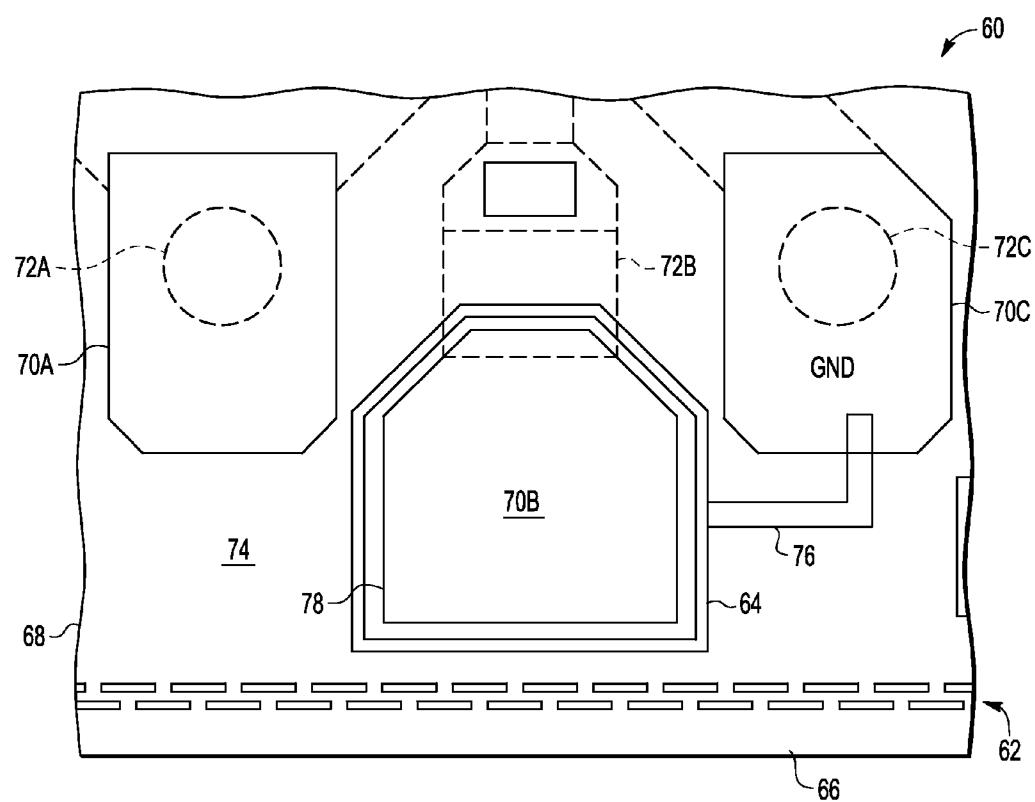
FIG. 3 is a top view of an exemplary semiconductor device having a bond pad surrounded by an ohmic fence in accordance with one embodiment.

FIG. 3 schematically depicts another exemplary IC chip 60 constructed in accordance with one or more aspect of the disclosure. The IC chip 60 includes a discontinuous guard ring 62 for chip-level moisture protection. Unlike the above-described example, the guard ring 62 does not include bridges or other connections to establish an operating voltage for the guard ring 62. Additional moisture protection is instead provided at the component level in this example. One or more circuit elements of the IC chip 60 are surrounded by respective, individual or component guard rings 64 as described below. The guard rings 64 may prevent moisture damage to the components in the event that the moisture passes through the guard ring 62. The individual or component-level guard rings 64 may provide additional or redundant protection from moisture entering along an edge 66 of the IC chip 60. Notwithstanding the moisture protection added by the component-level guard ring 64, the guard ring 62 may include bridges or be otherwise coupled to a voltage source to establish an operating voltage for the guard ring 62.

In some cases, the circuit elements are components of the IC chip 60 that are not passivated, covered, enclosed, or otherwise protected from ambient sources of moisture. Bond pads are examples of such unprotected circuit elements. The component-level guard rings 64 may also provide protection from moisture entering the IC chip 20 via the bond pad or other circuit element. The moisture may thus be prevented from traveling beyond the bond pad or other circuit element.

The IC chip 60 includes a semiconductor substrate 68, a number of circuit elements 70A-70C supported by the semiconductor substrate 68, and a number of circuit elements 72A-72C formed within the semiconductor substrate 68 and/or at a surface 74 of the semiconductor substrate 68. In this example, the circuit elements 70A-70C are configured as grounding pads (70A, 70C) or bond pads (70B) of a FET device. The pads 70A-70C may be coupled to respective ones of the circuit elements 72A-72C. In this example, the outer pads 70A and 70C are grounding pads for connections to a back side of the IC chip 60. In some cases, such grounding pads are configured to be probe-able, in which case an opening is formed in a passivation dielectric layer(s) to allow direct probing. In such cases, the grounding pads may be configured with humidity protection structures as described below in connection with the bond pad 70B. The outer bond pads 70A and 70C may be coupled to the circuit elements 72A and 72C, which may correspond with a source region of the FET device. The inner bond pad 70B may be coupled to the circuit element 72B, which may correspond with a drain region or gate of the FET device. The circuit elements 70A-70C need not be configured as bond pads, and may be other types of structures, such as interconnects. The circuit elements 70A-70C may be components of a variety of devices (e.g., non-FET devices), and need not be associated with a common device.

Unlike the chip-level guard ring 62, the guard ring 64 provides moisture protection for an individual or respective component or circuit element of the IC chip 60. In this example, the guard ring 64 is configured to protect only the bond pad 70B. The guard ring 64 is configured to surround the bond pad 70B, and may be shaped to match or follow the borders of the bond pad 70B. The guard ring 64 may run or extend between the bond pad 70B and other circuit elements, such as the circuit elements 70A and 70C. The guard ring 64 does not run along the periphery of the IC chip 60. As the guard ring 64 runs around the bond pad 70B, portions of the guard ring 64 are disposed within a central or inner area of the IC chip 60.

The guard ring 64 may be configured in a manner similar to the above-described guard rings. The guard ring 64 includes one or more metal layers supported by the semiconductor substrate 68. The guard ring 64 may be configured to form an alloy at the surface 74 of the semiconductor substrate 68 by, for instance, forming an ohmic interface as described above.

In this embodiment, the guard ring 64 is continuous, e.g., without breaks or gaps. In some cases, an ohmic metal layer deposited on the semiconductor substrate 68 may have a topology and/or pattern that avoids lift-off complications. However, the guard ring 64 may be staggered or otherwise discontinuous in some embodiments, which may be useful, for example, in cases where lift-off would otherwise be unreliable.

The guard ring 64 may be coupled to a voltage source to establish an operating voltage for the guard ring 64 as described above. In this example, the guard ring 64 is coupled to ground via an interconnect 76 that runs between the bond pad 70B and the bond pad 70C. Other voltage sources or levels may be used. For example, the guard ring 64 need not be coupled to a source of a FET device. The configuration and construction of the interconnect 76 may vary. In some cases, the interconnect 76 includes a metal stack having an ALD film deposited along sidewalls of the metal stack as described below.

The IC chip 60 may include a number of passivation layers disposed along, and supported by, the surface 74 of the semiconductor substrate 68. Examples of such passivation layers are described below in connection with FIGS. 4 and 5. One or more of the passivation layers may be patterned in connection with the deposition of the metal layers or stacks of the bond pads, interconnects, or other circuit elements supported by the semiconductor substrate 68.

The bond pad or other component-level moisture protection of the example of FIG. 2 may be incorporated into one or more of the other embodiments described herein. For instance, a metal stack of the bond pad 70B may be further protected from moisture via the deposition of an ALD film 78 along sidewalls as described below. The ALD film 78 is shown and described in greater detail in connection with the embodiments of FIGS. 4 and 5. Alternatively or additionally, one or both of the guard rings 62 and 64 may include a plurality of conductive structures spaced apart from one another in a staggered arrangement (see, e.g., FIG. 1) in which conductive bridges couple adjacent structures of the plurality of conductive structures to bias the adjacent structures at the operating voltage.

Figure 4:
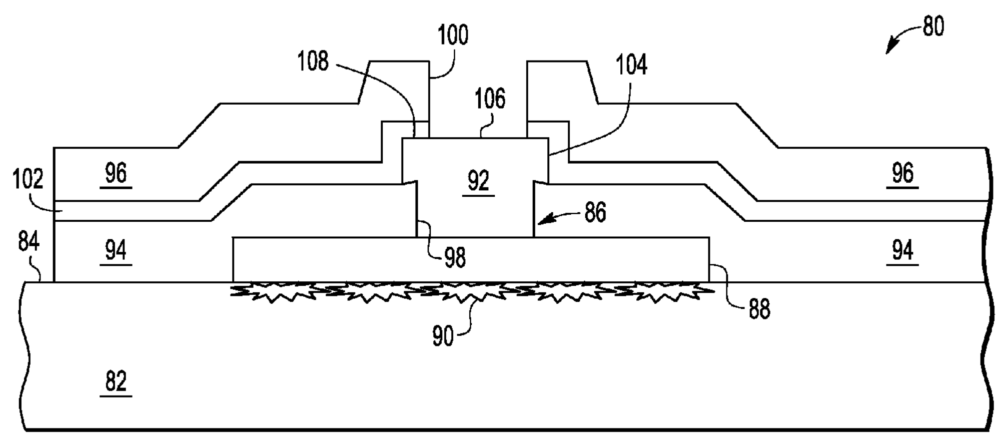
FIG. 4 is a cross-sectional, schematic view of a semiconductor device having a metal structure with sidewalls covered by atomic layer deposition (ALD) dielectric films in accordance with one embodiment.

FIG. 4 shows a portion of an IC chip 80 configured in accordance with one or more aspects of the disclosure. The IC chip 80 includes a semiconductor substrate 82 having a surface 84 on which a conductive structure 86 is disposed. The conductive structure 86 includes a number of metal layers supported by the semiconductor substrate 82. In this example, the conductive structure 86 includes a metal layer 88 that forms an ohmic interface 90 at the surface 84. The metal layer 88 may include any number of metal layers, such as transition or adhesion layers, in addition to the metal layer configured to form an alloy with the semiconductor substrate 82 at the surface 84. A metal stack 92 of the conductive structure 86 is deposited on a portion of the ohmic metal layer 88. The metal stack 92 may also include any number of metal layers for transition, adhesion, or other purposes. Notwithstanding the foregoing, the conductive structure 86 may include only a single metal layer instead of the metal stack 92.

The profile, construction, materials, configuration, and other characteristics of the conductive structure 86 may vary. The conductive structure 86 may be configured as a bond pad, an interconnect, a gate, a contact, a guard ring, or any other metal structure of the IC chip 80. The IC chip 80 may include a number of further metal layers in addition to those of the conductive structure 86. For example, the conductive structure 86 may be formed as part of a first metal layer (e.g., M1) of the IC chip 80, and further metal layers (e.g., M2, M3, etc.) may be subsequently deposited to form further conductive structures (e.g., interconnects).

The IC chip 80 further includes a number of passivation layers supported by the semiconductor substrate 82. The passivation layers may be configured in a metal/dielectric interconnect scheme directed to supporting multiple interconnect or other metal layers of the IC chip 80. In this example, the passivation layers include a lower dielectric layer 94 and an upper dielectric layer 96. Any number of dielectric layers may be deposited. The lower dielectric layer 94 may be disposed on or in contact with the surface 84 and the ohmic metal layer 88. The lower dielectric layer 94 is patterned to define the metal layer(s) of the metal stack 92. In this example, the metal stack 92 is deposited in an opening 98 in the lower dielectric layer 94, which, in turn, is located above the ohmic metal layer 88 to connect the ohmic metal layer 88 and the metal stack 92. The upper dielectric layer 96 may be disposed over the lower dielectric layer 94 and the metal stack 92, and then patterned to allow connections to the metal stack 92. In this example, an opening 100 in the upper dielectric layer 96 is formed above the opening 98. However, the location may vary. For example, the metal stack 92 need not connect to other metal layers at the same location at which the metal stack 92 connects to the ohmic metal layer 88.

To protect the conductive structure 86 and the remainder of the IC chip 80 from moisture, the IC chip 80 includes an intermediate dielectric layer 102 disposed along an edge(s) of the layer(s) of the metal stack 92 to cover a sidewall(s) 104 of the metal layer(s). The dielectric layer 102 may include a dielectric film configured to be conformal to the sidewall(s) 104. The dielectric film may be an ALD or other conformal film. The dielectric layer 102 is disposed between the metal stack 92 and the upper dielectric layer 96, which may not sufficiently adhere or otherwise conform to the sidewall(s) 104 of the metal stack 92. For example, the upper dielectric layer 96 may include a dielectric material deposited via a chemical vapor deposition (CVD) process that typically relies upon a metal adhesion layer to adhere to the metal stack 92. While the metal stack 92 may include an adhesion layer on a top surface 106 thereof, the adhesion layer is not present along the sidewall(s) 104. The ALD or other conformal film of the dielectric layer 102 is instead deposited along or at the edge of the metal stack 92 to cover the sidewall(s) 104. The ALD film may also cover a portion 108 of the surface 106 as shown. The ALD film of the dielectric layer 102 is patterned to define the opening 100. The ALD film need not be coextensive with the dielectric layer 94 and/or the dielectric layer 96 as shown. The ALD film may thus also be patterned to limit coverage to the area near the metal stack 92, in which case the dielectric layers 94 and 96 may be contiguous in some areas.

The ALD film is not limited to protecting a particular metal layer of the IC chip 80, such as the metal stack 92. For example, an ALD or other conformal dielectric layer or film may also be disposed along sidewall(s) of the ohmic metal layer 88.

The material of the ALD film may vary. For example, aluminum nitride (AlN), aluminum oxide ($Al_2O_3$), or hafnium oxide ($HfO_2$) may be deposited. One or more additional or alternative insulating materials may be used for the conformal sidewall coating.

Figure 5:
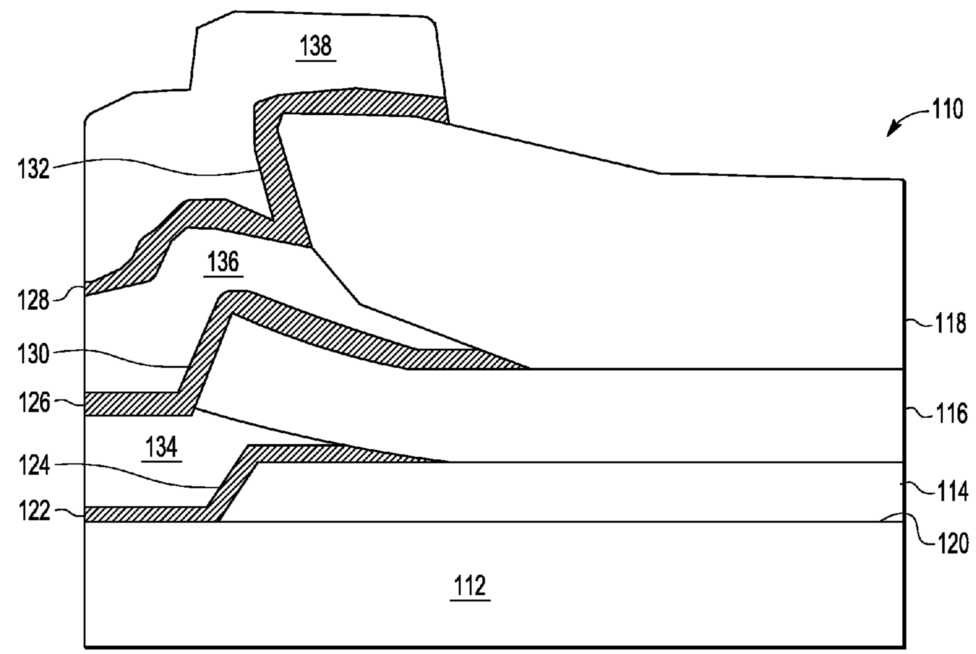
FIG. 5 is a partial, cross-sectional view of a metal stack having sidewalls covered by ALD dielectric films in accordance with one embodiment.

FIG. 5 depicts an example of a multiple layer metal stack 110 having ALD-based sidewall coating. The metal stack 110 may be disposed on a semiconductor substrate 112. In this example, the metal stack 110 includes three metal layers 114, 116, and 118. In some cases, the metal layer 114 is configured to form an ohmic contact at a surface 120 of the semiconductor substrate 112. The metal layers 114, 116, and 118 may form a single interconnect or metal structure, or may correspond with respective interconnects. For instance, any one or more of the metal layers may be directed to adhesion, transition, conduction, or other purposes. The nature of the metal stack 110 may thus vary. For instance, the metal stack 110 may be part of an interconnect (or set of interconnects), bond pad, gate, or any other conductive structure of an IC chip.

The metal layers 114, 116, and 118 are shown in greater detail in FIG. 5 to depict how the ALD-based sidewall coating addresses irregularities along edges of thereof. In this example, the sidewall coating is implemented on a metal layer-by-layer basis, with a respective ALD film for each metal layer. An ALD film 120 is deposited at or along a sidewall 122 of the metal layer 114. An ALD film 122 is deposited at or along a sidewall 124 of the metal layer 116. ALD films 126 and 128 are deposited at or along sidewalls 130 and 132 of the metal layers 116 and 118, respectively. As shown in FIG. 5, each sidewall 124, 130, 132 has a profile with a complex topology. In some cases, the complexity may exceed the example shown. For example, a sidewall may include any number of sharp points or recesses. The ALD films 122, 126, 128 provide a level of conformity to address such complexities.

In the example of FIG. 5, each layer of the stack 110 is separately passivated. Such passivation may support the use of the layers of the stack 110 as a number of interconnects. Each metal layer is passivated by an interlayer dielectric layer (ILD). The metal layers 114, 116, and 118 are passivated by dielectric layers 134, 136, and 138, respectively. Such passivation is in addition to any passivation provided by the ALD films 122, 126, 128. The coverage of the ALD films 122, 126, 128 may be limited to the area at, along, or otherwise near the sidewalls 124, 130, 132, such as the area shown.

The passivation and conformal sidewall coverage shown in FIG. 5 may be provided at one or more edges of the metal stack 110. The ALD films may be deposited and then patterned to provide the coverage at or along each such edge. The patterning may also be configured to forming the openings shown in FIG. 5, which may, for instance, be directed to establishing connections between the metal layers 114, 114, and 118. In some interconnect schemes, the connections need not be disposed in the same location as shown.

Figure 6:
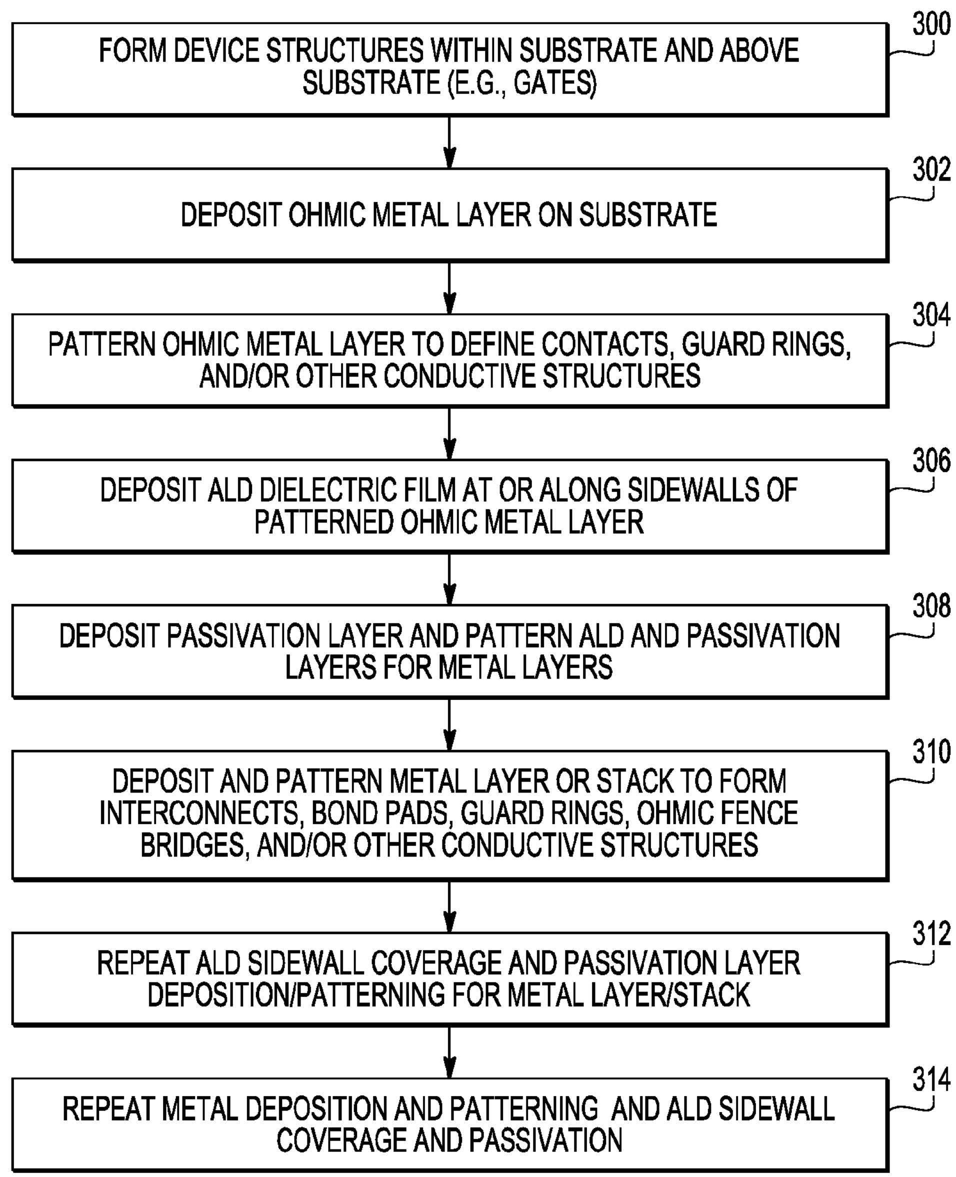
FIG. 6 is a flow diagram of an exemplary fabrication sequence to provide chip-level humidity protection for a semiconductor device in accordance with one embodiment.

FIG. 6 shows an exemplary fabrication method for fabricating an IC chip or electronic apparatus as described above. The IC chip is fabricated with a semiconductor substrate, which may be configured as described above. The method includes a sequence of acts or steps, only the salient of which are depicted for convenience in illustration. The ordering of the acts may vary in other embodiments. For example, the formation of the conductive structures may be performed in a different order. Additional, fewer, or alternative steps may be implemented. For example, one or more device implants may be implemented after the formation of one or more conductive structures. Other additional steps may involve the deposition of one or more materials to form various structures along a surface of the semiconductor substrate, such as a silicide block. The silicide block may be formed via deposition of a metal on silicon, heating to cause the metal to react with the silicon, and removal of any remaining unreacted metal. As another example, the ohmic metal layer of some embodiments is not coated with a conformal dielectric layer.

The method may begin with, or include, a step 300 in which a number of device structures are formed in a semiconductor substrate. The device structures may be formed by doping regions of the semiconductor substrate via, for instance, an implantation procedure. The regions may correspond with source regions, drain regions, device body regions, and other semiconductor device regions, and are not limited to any particular device type (e.g., FET device). Formation of the device structures need not involve doping the semiconductor substrate. For example, the device structures may include isolation trenches and other structures. The step 300 may also include the formation of a number of device structures on or otherwise above the semiconductor substrate. For example, gate structures, silicide blocks, and other structures supported by the semiconductor substrate may be formed. In some cases, the IC chip may include one or more device structures formed at a later stage of the fabrication process. Not all device structures need be formed at this point in the process.

The semiconductor substrate may any type, including, for example, an SOI substrate. The semiconductor substrate may include an original p-type semiconductor substrate on which the insulator, epitaxial, or other layers are grown or otherwise formed. In one example, an n+ buried layer is formed before the growth of the epitaxial layer(s) to achieve a depth that may not be possible or practical via an implantation-based procedure.

In a step 302, an ohmic metal layer is deposited on the semiconductor substrate. The ohmic metal layer may be directed to forming conductive structures corresponding with a variety of device or circuit elements, including, for instance, device contacts or guard rings, as described above. The ohmic metal layer may include one or more metals or metal layers. In some cases, a silicide is formed at the surface. The metal layer(s) may be deposited via any deposition process, including electroplating or other processes.

In the example, of FIG. 6, the ohmic metal layer may then be patterned to define the conductive structures to be formed. Any patterning technique may be used, including, for instance, lift-off techniques. Edges of the ohmic metal layer are defined, leaving one or more sidewalls (depending on the number of metal layers deposited). The sidewall(s) is/are covered or coated in this embodiment by a conformal dielectric film deposited in a step 306. The conformal dielectric film may be deposited via an ALD process as described above. The ALD or other conformal dielectric film may have a thickness, for example, in a range from about 100 Angstroms to about 1000 Angstroms. The conformal dielectric film is deposited at or along the edges of the ohmic metal layer to cover the sidewall(s).

In a step 308, a dielectric passivation layer is deposited to support the formation of one or more metal interconnect layers. A variety of dielectric materials may be used for the passivation layer, including, for instance, silicon nitride ($Si_3N_4$). The dielectric passivation layer may be deposited via a variety of different processes, including various CVD processes. In this example, the conformal dielectric film and the dielectric passivation layer are patterned together in the step 308. The conformal dielectric film may be patterned separately in other embodiments.

After the patterning of the passivation layer, a metal layer or stack may then be deposited in a step 310 to form a variety of different circuit elements, device structures, or other conductive structures. Such elements or structures may include, for instance, interconnects, bond pads, guard rings, and bridges between guard ring structures. The elements or structures may be connected to the ohmic metal layer, as with the bridges between the ohmic fences described above. The metal layer or stack may be patterned to define the elements and structures.

ALD or other conformal dielectric coverage of the sidewalls along the edges defined by such patterning may then be repeated in a step 312. Alternatively, separate conformal dielectric films may be deposited during the formation of the layers of a metal stack. The step 312 may include deposition of another passivation layer to allow further metal layers to be deposited and defined in a step 314. Patterning of the conformal dielectric film and passivation layer may be implemented as part of the steps 312 and/or 314, which may be repeated any number of iterations to accommodate, for instance, a desired number of metal interconnect layers.

Additional acts may be implemented at various points during the fabrication procedure. Any number of metal layers may be deposited to establish interconnections and create circuit elements of the IC chip. The procedures may be implemented in various orders. Additional or alternative procedures may be implemented.

In a first aspect, an electronic apparatus includes a semiconductor substrate, a device structure supported by the semiconductor substrate, and a guard ring surrounding the device structure. The guard ring includes a plurality of conductive structures spaced apart from one another, supported by the semiconductor substrate, and coupled to a voltage source to establish an operating voltage for the guard ring.

In a second aspect, an electronic apparatus includes a semiconductor substrate, a circuit element supported by the semiconductor substrate, a bond pad coupled to the circuit element and supported by the semiconductor substrate, and a guard ring extending between the circuit element and the bond pad, surrounding the bond pad, supported by the semiconductor substrate, and coupled to a voltage source to establish an operating voltage for the guard ring.

In a third aspect, a method of fabricating an electronic apparatus includes forming a device structure of the electronic apparatus within a semiconductor substrate, defining an edge of a first metal layer supported by the semiconductor substrate, the edge including a sidewall, depositing an atomic layer deposition (ALD) dielectric film along the edge of the first metal layer to cover the sidewall of the first metal layer, depositing a dielectric layer on the first metal layer, and defining a second metal layer supported by the semiconductor substrate with the dielectric layer between the first and second metal layers.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. An electronic apparatus comprising:

a semiconductor substrate;

a device structure supported by the semiconductor substrate;

a guard ring surrounding the device structure;

wherein the guard ring comprises a plurality of conductive structures spaced apart from one another, supported by the semiconductor substrate, and coupled to a voltage source to establish an operating voltage for the guard ring.

2. The electronic apparatus of claim 1, wherein adjacent conductive structures of the plurality of conductive structures laterally overlap one another in a staggered arrangement.

3. The electronic apparatus of claim 1, wherein the guard ring further comprises a conductive bridge coupling adjacent structures of the plurality of conductive structures to bias the adjacent structures at the operating voltage.

4. The electronic apparatus of claim 1, wherein the guard ring is disposed along a periphery of the semiconductor substrate.

5. The electronic apparatus of claim 1, wherein the device structure comprises a bond pad, and the guard ring is disposed along a periphery of the bond pad.

6. The electronic apparatus of claim 1, wherein the voltage source is configured to provide ground potential.

7. The electronic apparatus of claim 1, wherein each conductive structure comprises a metal layer that forms an alloy to establish an ohmic interface with the semiconductor substrate such that the guard ring is configured as an ohmic fence.

8. The electronic apparatus of claim 1, wherein the semiconductor substrate comprises a Group III-V semiconductor material.

9. The electronic apparatus of claim 1, wherein the device structure comprises:

a metal layer supported by the semiconductor substrate;

a first dielectric layer patterned to define the metal layer; and a second dielectric layer disposed between the first dielectric layer and the metal layer and comprising an atomic layer deposition (ALD) film, the ALD film being disposed along an edge of the metal layer to cover a sidewall of the metal layer.

10. An electronic apparatus comprising:

a semiconductor substrate;

a circuit element supported by the semiconductor substrate;

a bond pad coupled to the circuit element and supported by the semiconductor substrate;

a first guard ring surrounding the circuit element and the bond pad, the first guard ring comprising a plurality of conductive structures spaced from one another and supported by the semiconductor substrate; and a second guard ring extending between the circuit element and the bond pad, surrounding the bond pad, supported by the semiconductor substrate, and coupled to a voltage source to establish an operating voltage for the second guard ring.

11. The electronic apparatus of claim 10, wherein the second guard ring comprises a plurality of conductive structures spaced apart from one another.

12. The electronic apparatus of claim 10, wherein the plurality of conductive structures are disposed in a laterally staggered arrangement.

13. The electronic apparatus of claim 11, wherein the first guard ring further comprises a plurality of conductive bridges coupling adjacent structures of the plurality of conductive structures to bias the adjacent structures at the operating voltage.

14. The electronic apparatus of claim 10, wherein the second guard ring comprises a metal layer that forms an alloy with the semiconductor substrate to establish an ohmic interface with the semiconductor substrate such that the second guard ring is configured as an ohmic fence.

15. The electronic apparatus of claim 10, further comprising:

a first dielectric layer patterned to expose the bond pad; and a second dielectric layer disposed between the first dielectric layer and the bond pad and along an edge of the bond pad to cover a sidewall of the bond pad.

16. The electronic apparatus of claim 15, wherein the second dielectric layer comprises an atomic layer deposition (ALD) film.

17. A method of fabricating an electronic apparatus, the method comprising:

forming a device structure of the electronic apparatus within a semiconductor substrate;

defining an edge of a first metal layer supported by the semiconductor substrate, the edge comprising a sidewall;

depositing an atomic layer deposition (ALD) dielectric film along the edge of the first metal layer to cover the sidewall of the first metal layer;

depositing a dielectric layer on the first metal layer; and defining a second metal layer supported by the semiconductor substrate with the dielectric layer between the first and second metal layers.

18. The method of claim 17, wherein the first metal layer is configured to form an ohmic interface with the semiconductor substrate.

19. The method of claim 17, wherein defining the edge of the first metal layer comprises defining an Ohmic fence surrounding a periphery of the semiconductor substrate.

20. The method of claim 17, wherein defining the edge of the first metal layer comprises defining a bond pad such that the ALD dielectric film covers a sidewall of the bond pad.

* * * * *